US012577462B2

(12) United States Patent
Emoto

(10) Patent No.: US 12,577,462 B2
(45) Date of Patent: Mar. 17, 2026

(54) PHOSPHOR POWDER, LIGHT-EMITTING DEVICE, IMAGE DISPLAY DEVICE, AND ILLUMINATION DEVICE

(71) Applicant: DENKA COMPANY LIMITED, Tokyo (JP)

(72) Inventor: Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 365 days.

(21) Appl. No.: 18/039,675

(22) PCT Filed: Nov. 11, 2021

(86) PCT No.: PCT/JP2021/041488
§ 371 (c)(1),
(2) Date: May 31, 2023

(87) PCT Pub. No.: WO2022/123997
PCT Pub. Date: Jun. 16, 2022

(65) Prior Publication Data
US 2024/0002721 A1 Jan. 4, 2024

(30) Foreign Application Priority Data
Dec. 7, 2020 (JP) .................................. 2020-202770

(51) Int. Cl.
C09K 11/77 (2006.01)
C01B 21/06 (2006.01)
H10H 20/851 (2025.01)

(52) U.S. Cl.
CPC .... *C09K 11/77218* (2021.01); *C01B 21/0602* (2013.01); *H10H 20/8512* (2025.01);
(Continued)

(58) Field of Classification Search
CPC ................ C09K 11/0883; C09K 11/64; C09K 11/77348; C09K 11/646; H10H 20/8512; C01P 2006/60
See application file for complete search history.

(56) References Cited

U.S. PATENT DOCUMENTS 8,901,591 B2  12/2014  Yoshimura et al.
9,382,475 B2   7/2016  Emoto
(Continued)

FOREIGN PATENT DOCUMENTS

CN       116457442 A      7/2023
CN       116507693 A      7/2023
(Continued)

OTHER PUBLICATIONS

Yasao et al, JP 2010196049A, Phosphor and Method for producing the same, Phosphor Containing Composition, Sep. 9, 2010 (Year : 2010).*
(Continued)

*Primary Examiner* — Alexander G Ghyka
(74) *Attorney, Agent, or Firm* — Oliff PLC

(57) ABSTRACT

A phosphor powder including phosphor particles which are a phosphor represented by a general formula $M_x(Si, Al)_2(N, O)_{3\pm y}$ (where M is Li and one or more alkaline earth metal elements and $0.52 \leq x \leq 0.9$ and $0.06 \leq y \leq 0.36$ are satisfied) and in which a part of M is substituted with a Ce element, wherein a Si/Al atomic ratio is equal to or more than 1.5 and equal to or less than 6, an O/N atomic ratio is equal to or more than 0 and equal to or less than 0.1, 5 to 50 mol % of M is Li, and 0.5 to 10 mol % of M is Ce, and a total content of a Cr element, a Fe element, and a Ni element in the phosphor powder is equal to or less than 20.0 ppm.

6 Claims, 1 Drawing Sheet

(52) U.S. Cl.
CPC ...... *C01P 2002/52* (2013.01); *C01P 2004/61* (2013.01); *C01P 2006/60* (2013.01)

(56) References Cited

U.S. PATENT DOCUMENTS

| | | |
|---|---|---|
| 11,898,079 B2 | 2/2024 | Nomiyama et al. |
| 2012/0019127 A1 | 1/2012 | Hirosaki |
| 2013/0277698 A1 | 10/2013 | Yoshimura et al. |
| 2013/0328478 A1 | 12/2013 | Emoto |
| 2021/0017448 A1 | 1/2021 | Toyoshima et al. |
| 2021/0130689 A1 | 5/2021 | Akabane et al. |
| 2022/0145176 A1 | 5/2022 | Nomiyama et al. |
| 2023/0407171 A1 | 12/2023 | Emoto |
| 2023/0407172 A1 | 12/2023 | Emoto |
| 2024/0010914 A1 | 1/2024 | Emoto |

FOREIGN PATENT DOCUMENTS

| | | |
|---|---|---|
| CN | 116508168 A | 7/2023 |
| JP | 2008-088362 A | 4/2008 |
| JP | 2009-167328 A | 7/2009 |
| JP | 2015-000953 A | 1/2015 |
| JP | 5969391 B2 | 8/2016 |
| TW | 201942333 A | 11/2019 |
| TW | 201942336 A | 11/2019 |
| WO | 2010/110457 A1 | 9/2010 |
| WO | 2012/014701 A1 | 2/2012 |
| WO | 2012/067130 A1 | 5/2012 |
| WO | 2020/203486 A1 | 10/2020 |

OTHER PUBLICATIONS

He et al., "Effects of Trace Elements Doping on the Long-term Performance of Red Phosphor (Sr, Ca) AlSiN3 : Eu2+ Used for WLED," Chinese Journal of Luminescence, Mar. 2015, vol. 36, No. 3, pp. 257-261.

Apr. 15, 2024 Office Action issued in Chinese Patent Application No. 202180081077.4.

Feb. 1, 2022 International Search Report issued in International Patent Application No. PCT/JP2021/041488.

* cited by examiner

[Fig. 1]
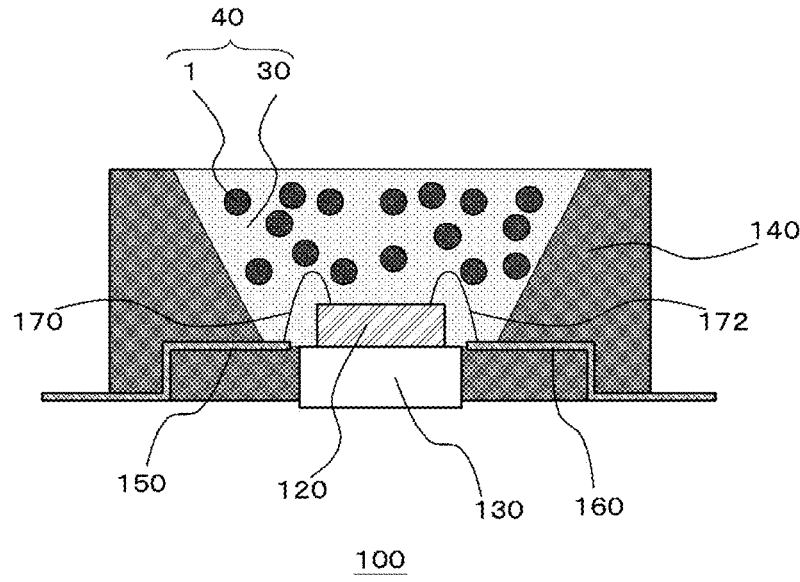
[Fig. 2]
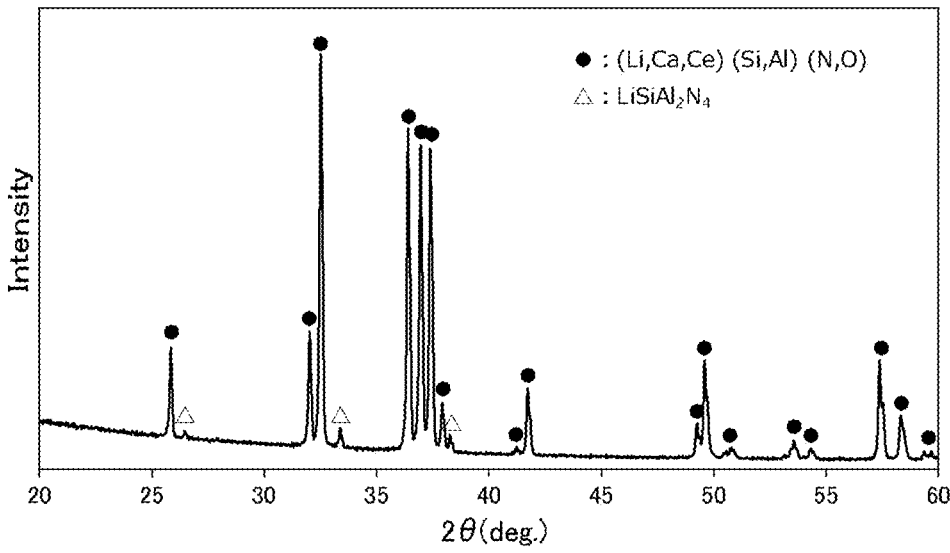

PHOSPHOR POWDER, LIGHT-EMITTING DEVICE, IMAGE DISPLAY DEVICE, AND ILLUMINATION DEVICE

TECHNICAL FIELD

The present invention relates to a phosphor powder, a light-emitting device, an image display device, and an illumination device.

BACKGROUND ART

Phosphors are commonly used to manufacture white LED (Light Emitting Diode). That is, a phosphor is used as a wavelength conversion material for obtaining white light from blue light emitted from a blue LED.

With the spread of white LED for illumination and studies regarding application of the white LED to image display devices, phosphors capable of converting blue light into light having longer wavelengths are continuously being developed.

An aspect of improving a phosphor is to modify a chemical composition of the phosphor.

For example, Patent Document 1 discloses a phosphor which is represented by a general formula $M_x(Si, Al)_2(N, O)_{3\pm y}$ (where M is Li and one or more alkaline earth metal elements and $0.52 \leq x \leq 0.9$ and $0.06 \leq y \leq 0.23$ are satisfied) and in which a part of M is substituted with a Ce element, in which the phosphor which is a Si/Al atomic ratio is equal to or more than 1.5 and equal to or less than 6, an O/N atomic ratio is equal to or more than 0 and equal to or less than 0.1, 5 to 50 mol % of M is Li, and 0.5 to 10 mol % of M is Ce.

RELATED DOCUMENT

Patent Document

Patent Document 1: Japanese Patent No. 5969391

SUMMARY OF THE INVENTION

Technical Problem

As a finding of the present inventor, a phosphor disclosed in Patent Document 1 has room for improvement in terms of a fluorescence peak intensity when the phosphor is irradiated with blue light.

The present inventor herein conducted studies to provide a phosphor powder having a great fluorescence peak intensity when a phosphor is irradiated with blue light, as one of the object.

Solution to Problem

The present inventors completed the invention provided below as a result of the studies.

According to the present invention, there is provided a phosphor powder including phosphor particles which are a phosphor represented by a general formula $M_x(Si, Al)_2(N, O)_{3\pm y}$ (where M is Li and one or more alkaline earth metal elements and $0.52 \leq x \leq 0.9$ and $0.06 \leq y \leq 0.36$ are satisfied) and in which a part of M is substituted with a Ce element, wherein a Si/Al atomic ratio is equal to or more than 1.5 and equal to or less than 6, an O/N atomic ratio is equal to or more than 0 and equal to or less than 0.1, 5 to 50 mol % of M is Li, and 0.5 to 10 mol % of M is Ce, and a total content of a Cr element, a Fe element, and a Ni element in the phosphor powder is equal to or less than 20 ppm.

In addition, according to the present invention, there is provided a light-emitting device including the phosphor powder described above and a light emitting source.

In addition, according to the present invention, there is provided an image display device including the light-emitting device described above.

In addition, according to the present invention, there is provided an illumination device including the light-emitting device described above.

Advantageous Effects of Invention

The phosphor powder of the present invention can provide a phosphor powder having a high fluorescence peak intensity when the phosphor is irradiated with blue light.

BRIEF DESCRIPTION OF THE DRAWINGS

FIG. 1 is a schematic cross-sectional view showing an example of a structure of a light-emitting device.

FIG. 2 is an XRD pattern obtained by powder X-ray diffraction (XRD) measurement of a phosphor of Example 1.

DESCRIPTION OF EMBODIMENTS

Hereinafter, an embodiment of the present invention will be described in detail while referring to drawings.

In the drawings, similar components are designated by the same reference numerals, and the description thereof will not be repeated.

The drawings are for explanation purposes only. A shape or a dimensional ratio of each member in the drawing does not necessarily correspond to an actual article.

In the present specification, the notation "X to Y" in the description of the numerical range indicates X or more and Y or less unless otherwise specified. For example, "1 to 5% by mass" means "equal to or more than 1% by mass and equal to or less than 5% by mass".

<Phosphor Powder>

A phosphor powder of the present embodiment includes phosphor particles represented by a general formula $M_x(Si, Al)_2(N, O)_{3\pm y}$. In this general formula, M represents Li and one or more alkaline earth metal elements, and $0.52 \leq x \leq 0.9$ and $0.06 \leq y \leq 0.36$ are satisfied. In addition, a part of M is substituted with a Ce element, a Si/Al atomic ratio is equal to or more than 1.5 and equal to or less than 6, an O/N atomic ratio is equal to or more than 0 and equal to or less than 0.1, 5 to 50 mol % of M % is Li, and 0.5 to 10 mol % of M is Ce.

A total content of a Cr element, a Fe element, and a Ni element in the phosphor powder is equal to or less than 20 ppm.

According to the findings of the present inventor, it was found that fluorescence properties of the phosphor can be evaluated by using contents of a plurality of elements included in the phosphor powder in trace amounts as an index. As a result of intensive studies based on this finding, it was found that, the fluorescence properties can be stably evaluated by using the total content of the Cr element, the Fe element, and the Ni element as an index, and a phosphor powder having a high fluorescence peak intensity when the phosphor is irradiated with blue light can be realized by setting a total value of the content, which is the index, to be equal to or less than the upper limit value.

The upper limit of the total content of the Cr element, the Fe element, and the Ni element is equal to or less than 20 ppm, preferably equal to or less than 15 ppm, and more preferably equal to or less than 10 ppm. Accordingly, it is possible to realize a phosphor powder having a high fluorescence peak intensity when the phosphor is irradiated with blue light.

The lower limit of the total content is not particularly limited, and may be equal to or more than 0 ppm or equal to or more than 0.01 ppm.

An upper limit of the content of the Cr element is equal to or less than 10 ppm, preferably equal to or less than 5 ppm, and more preferably equal to or less than 3 ppm. Accordingly, it is possible to realize a phosphor powder having high internal quantum efficiency and improved blue light conversion efficiency.

A lower limit of the content of the Cr element is not particularly limited, and may be equal to or more than 0 ppm or equal to or more than 0.01 ppm.

An upper limit of the content of the Fe element is equal to or less than 20 ppm, preferably equal to or less than 15 ppm, and more preferably equal to or less than 10 ppm. Accordingly, it is possible to realize a phosphor powder having high internal quantum efficiency and improved blue light conversion efficiency.

A lower limit of the content of the Fe element is not particularly limited, and may be equal to or more than 0 ppm or equal to or more than 0.01 ppm.

An upper limit of the content of the Ni element is equal to or less than 10 ppm, preferably equal to or less than 5 ppm, and more preferably equal to or less than 3 ppm. Accordingly, it is possible to realize a phosphor powder having high internal quantum efficiency and improved blue light conversion efficiency.

A lower limit of the content of the Ni element is not particularly limited, and may be equal to or more than 0 ppm or equal to or more than 0.01 ppm.

An upper limit of the content of the Ti element is equal to or less than 10 ppm, preferably equal to or less than 5 ppm, and more preferably equal to or less than 3 ppm. Accordingly, it is possible to realize a phosphor powder having high internal quantum efficiency and improved blue light conversion efficiency.

A lower limit of the content of the Ti element is not particularly limited, and may be equal to or more than 0 ppm or equal to or more than 0.01 ppm.

The phosphor powder is dissolved with a mixed acid of hydrofluoric acid and nitric acid by a pressure acid decomposition method, and then, the Cr element, the Fe element, the Ni element, and the Ti element can be measured by an ICP emission spectrometer.

A content of 0 ppm means a detection limit of a measuring device.

In the present embodiment, the phosphor powder, in which the contents of the Cr element, the Fe element, the Ni element, and the Ti element satisfy desired ranges, can be produced by selecting suitable production method•production conditions, in addition to usage of suitable materials. The "suitable production method•production conditions" is, for example, one or two or more of (i) performing a suitable classification treatment (preferably sedimentation classification) on the phosphor powder, (ii) devising an acid treatment, and the like. The production method•production conditions will be described later in more detail.

The description of the phosphor powder of the present embodiment will be continued.

(Crystal Structure, Chemical Composition, and the Like)

A skeleton structure of a phosphor crystal is composed of $(Si, Al)$—$(N, O)_4$ regular tetrahedrons bonded together, and an M element is located in the interstices. A composition of the general formula described above is satisfied in a wide range in which electrical neutrality is maintained by all the parameters of a valence and an amount of the M element, the Si/Al ratio, and the N/O ratio. As a representative phosphor represented by the general formula described above, there is $CaAlSiN_3$ where the M element is Ca, x=1, Si/Al=1, and O/N=0. When a part of Ca in $CaAlSiN_3$ is substituted with Eu, it becomes a red phosphor, and when a part thereof is substituted with Ce, it becomes a yellow-orange phosphor.

The crystal structure of the phosphor particles included in the phosphor powder of the present embodiment is usually based on $CaAlSiN_3$ crystals. One of features of the phosphor particles is that constituent elements and a composition are greatly changed so that an extremely high light emission efficiency can be obtained even with Ce activation.

In the general formula described above, the M element is a combination of a Li element and an alkaline earth metal element, and a part thereof is substituted with a Ce element serving as a light emission center. By using the Li element, an average valence of the M element can be widely controlled by combining with a divalent alkaline earth element and a trivalent Ce element. In addition, since an ionic radius of $Li^+$ is extremely small, a crystal size can be changed greatly depending on the amount thereof, and various fluorescence emissions can be obtained.

A coefficient x of the M element in the general formula described above is equal to or more than 0.52 and equal to or less than 0.9, preferably equal to or more than 0.6 and equal to or less than 0.9, and more preferably equal to or more than 0.7 and equal to or less than 0.9. When the coefficient x exceeds 0.9, that is, when it approaches the $CaAlSiN_3$ crystal, the fluorescence intensity tends to decrease. When the coefficient x is smaller than 0.52, a large amount of a heterogeneous phase other than the desired crystal phase is generated, and thus, the fluorescence intensity tends to significantly decrease.

In the present embodiment, when the electrical neutrality is maintained by the average valence or the amount of the M element, the Si/Al ratio, and the O/N ratio and there is no defects or the like in a single crystal, y=0. However, when considering the composition of the entire phosphor, a secondary crystal phase or an amorphous phase exists, and even when considering the crystal itself, a charge balance may be lost due to crystal defects. In the present embodiment, from a viewpoint of increasing the fluorescence intensity, y is preferably equal to or more than 0.06 and equal to or less than 0.36, more preferably equal to or more than 0.1 and equal to or less than 0.35, and even more preferably equal to or more than 0.06 and equal to or less than 0.23.

In the present embodiment, the O/N atomic ratio (a molar ratio) is equal to or more than 0 and equal to or less than 0.1, preferably equal to or more than 0.01 and equal to or less than 0.08, and more preferably equal to or more than 0.02 and equal to or less than 0.07. When the O/N atomic ratio is too large, the amount of the heterogeneous phases generated increases, the light emission efficiency decreases, a covalent bonding property of the crystal tends to decrease, and a deterioration of a temperature property (a decrease in luminance at a high temperature) tends to be caused.

The Si/Al atomic ratio (the molar ratio) is usually inevitably determined when the average valence or the amount of the M element and the O/N atomic ratio are set in predetermined ranges. The Si/Al atomic ratio is equal to or more than 1.5 and equal to or less than 6, preferably equal to or more than 2 and equal to or less than 4, and more preferably equal to or more than 2.5 and equal to or less than 4.

A Li content in the phosphor particles is 5 to 50 mol %, preferably 15 to 45 mol %, and more preferably 25 to 45 mol % of the M element. An effect of Li is likely to be exhibited, when the Li content is equal to or more than 5 mol %, but, if the Li content exceeds 50 mol %, the desired crystal structure of the phosphor cannot be maintained, the hetero-geneous phases are generated, and the light emission effi-ciency is likely to decrease.

Just to be sure, the "Li content" is the Li content in the finally obtained phosphor powder, not the amount based on a raw material mixture. The Li compound used as a raw material has a high vapor pressure and is easily volatilized, and a considerable amount volatilizes when an attempt is made to synthesize a nitride•oxynitride at a high tempera-ture. That is, the amount of Li based on the raw material mixture is largely different from the content in the final product, and thus, does not mean the Li content in the phosphor.

When the content of Ce, which is the light emission center of the phosphor particles, is too small, the contribution to the light emission tends to decrease. When the content thereof is too great, concentration quenching of the phosphor due to energy transfer between $Ce^{3+}$ tends to occur. Therefore, the content of Ce is 0.5 to 10 mol % and preferably 0.5 to 5 mol % of the M element.

The alkaline earth metal element used as the M element in the general formula described above may be any element, but, in a case where Ca is used, a high fluorescence intensity is obtained and the crystal structure is stabilized in a wide composition range. Therefore, the M element is preferably Ca. A combination of a plurality of alkaline earth metal elements may be used, and for example, a part of the Ca element may be substituted with a Sr element.

The crystal structure of the phosphor particles is ortho-rhombic, and may have the same structure as the $CaAlSiN_3$ crystal described above. Lattice constants of the $CaAlSiN_3$ crystal are, as an example, a=0.9800 nm, b=0.5649 nm and c=0.5062 nm. In the present embodiment, the lattice con-stants are usually a=0.9350 to 0.9650 nm, b=0.5500 to 0.5700 nm, and c=0.4800 to 0.5000 nm, and all of the values are small values compared to the $CaAlSiN_3$ crystal. The ranges of the lattice constants reflect the constituent ele-ments and the composition described above.

A crystal phase present in the phosphor particles is preferably the single crystal phase described above. How-ever, the phosphor particles may include a heterogeneous phase as long as the fluorescence properties are not signifi-cantly affected. Examples of the heterogeneous phase hav-ing a low effect on the fluorescence properties in a case of blue light excitation are α-sialon, AlN, $LiSi_2N_3$, and $LiAlSi_2N_4$. The amount of the heterogeneous phase is pref-erably an amount such that a diffraction line intensity of other crystal phases with respect to a strongest diffraction line intensity of the crystal phase is equal to or less than 40% when evaluated by a powder X-ray diffraction method.

The phosphor powder of the present embodiment is excited by light having a wide wavelength range from ultraviolet to visible light. For example, in a case where blue light having a wavelength of 455 nm is emitted, broad fluorescence emission with a half width of the fluorescence spectrum equal to or more than 125 nm may be exhibited with orange light having a peak wavelength of 570 to 610 nm. Such a phosphor powder is suitable as a phosphor for wide-range light-emitting devices. In addition, the phosphor powder of the present embodiment has excellent heat resis-tance and chemical stability and a property, in which a luminance decrease due to an increase in temperature is small, in the same manner as a nitride•oxynitride-based phosphor of the related art represented by $CaAlSiN_3$. Such properties are particularly suitable for applications requiring durability.

(Particle Size Distribution)

By suitably designing a particle size distribution of the phosphor powder of the present embodiment, quantum efficiency may be further increased or the balance of various performances may be improved.

Specifically, a volume-based cumulative 50% size D50 (a so-called median size) of the phosphor powder of the present embodiment measured by a laser diffraction scattering method is preferably equal to or more than 8 μm and equal to or less than 25 μm, more preferably equal to or more than 10 μm and equal to or less than 20 μm, and more preferably equal to or more than 12 μm and equal to or less than 20 μm.

From another viewpoint, a volume-based cumulative 10% size $D_{10}$ of the phosphor powder of the present embodiment measured by the laser diffraction scattering method is pref-erably equal to or more than 2 μm and equal to or less than 15 μm and more preferably equal to or more than 5 μm and equal to or less than 12 μm. A comparatively large value of $D_{10}$ corresponds to a comparatively small amount of a fine powder (excessively fine phosphor particles in which the conversion efficiency of the blue light tends to decrease) in the phosphor powder. Therefore, the conversion efficiency of the blue light tends to increase, when $D_{10}$ is a relatively large value.

From another viewpoint, a volume-based cumulative 90% size $D_{90}$ of the phosphor powder of the present embodiment measured by the laser diffraction scattering method is pref-erably equal to or more than 15 μm and equal to or less than 50 μm and more preferably equal to or more than 18 μm and equal to or less than 40 μm. $D_{90}$ that is not excessively large corresponds to a small amount of coarse particles in the phosphor powder. The phosphor powder having $D_{90}$ that is not excessively large is effective in reducing the chromatic-ity variation of the light-emitting device.

In addition, in general, as a particle size of particles included in the powder increases, the effect of light scatter-ing decreases and diffuse reflectance tends to decrease. In other words, a size of the particle and the diffuse reflectance are in a relationship of trade-off. However, although a preferred particle size ($D_{50}$ or the like) of the phosphor powder of the present embodiment is comparatively large, the diffuse reflectance of the phosphor powder of the present embodiment tends to be comparatively large.

(Production Method)

The phosphor powder of the present embodiment is preferably produced by a series of steps including the following (1) to (4), a series of steps including (1) to (3) and (5), or a series of steps including (1) to (5). From a viewpoint of suitably adjusting $(D_{90}-D_{10})/D_{50}$, a production step of the phosphor powder preferably includes a (5) classification step (preferably a sedimentation classification).

(1) Preparation step of raw material mixed powder
  (2) Firing step
  (3) Pulverization step of fired product
  (4) Acid treatment step
  (5) Classification step (preferably sedimentation classifi-
    cation)
  (1) to (5) will be specifically described below.

(1) Preparation Step of Raw Material Mixed Powder

In the preparation step of raw material mixed powder, a raw material mixed powder is normally obtained by mixing suitable raw material powders.

As the raw material powder, nitrides of constituent elements such as silicon nitride, aluminum nitride, lithium nitride, cerium nitride, and nitrides of alkaline earth elements (for example, calcium nitride) are preferably used. In general, a nitride powder is unstable in air, and the particle surface is covered with an oxide layer, and as a result, even in a case where the nitride raw material is used, a certain amount of oxide is contained in the raw material. In a case of controlling the O/N ratio of the phosphor, when these are considered and the amount of oxygen is insufficient, a portion of the nitride may be an oxide (including a compound that becomes an oxide by heat treatment). Examples of oxide can include cerium oxide and the like.

Among the raw material powders, a lithium compound is remarkably volatilized by heating, and most of them may be volatilized depending on a firing condition. Therefore, it is preferable to determine the amount of the lithium compound to be blended in consideration of the volatilization amount during a firing process according to the firing condition.

Among the nitride raw material powders, lithium nitride, cerium nitride, and nitride of the alkaline earth element react violently with moisture in the air. Therefore, it is preferable to carry out these handlings in a glove box substituted with an inert atmosphere.

From a viewpoint of work efficiency, it is preferable that, (i) first, predetermined amounts of the raw material powders of silicon nitride, aluminum nitride, and various oxides that can be handled in the air are weighed and thoroughly mixed in the air in advance to prepare a premixed powder, (ii) then, the premixed powder is mixed with a substance such as lithium nitride that reacts easily with moisture in a glove box to prepare a raw material mixed powder.

(2) Firing Step

In the firing step, the raw material mixed powder prepared in the (1) preparation step of raw material mixed powder is filled in a suitable container and heated using a firing furnace or the like.

A firing temperature is preferably 1600° C. to 2000° C. and more preferably 1700° C. to 1900° C., from viewpoints of sufficiently proceeding the reaction and suppressing the volatilization of lithium.

A firing time is preferably 2 to 24 hours and more preferably 4 to 16 hours, from viewpoints of sufficiently proceeding the reaction and suppressing the volatilization of lithium.

The firing step is preferably performed in a nitrogen atmosphere. In addition, it is preferable to appropriately adjust a pressure of the firing atmosphere. Specifically, the pressure of the firing atmosphere is preferably equal to or more than 0.5 MPa·G. Particularly, in a case where the firing temperature is equal to or higher than 1800° C., the phosphor tends to be easily decomposed, but the high pressure of the firing atmosphere can suppress the decomposition of the phosphor.

Incidentally, considering industrial productivity, the pressure of the firing atmosphere is preferably less than 1 MPa·G.

It is preferable that the container filled with the raw material mixed powder is formed of a material that is stable in a high-temperature nitrogen atmosphere and does not react with the raw material mixed powder or a reaction product thereof. A material of the container is preferably boron nitride.

(3) Pulverization Step of Fired Product

Since a fired product obtained in (2) is usually in the form of a block, it is preferable to pulverize it to a somewhat small size by applying a mechanical force.

In the pulverization, various devices such as a crusher, a mortar, a ball mill, a vibration mill, a jet mill, and a stamp mill can be used. Two or more of these devices may be combined for the pulverization. In examples which will be described later, first, a stamp mill is used to obtain a coarsely pulverized product of the fired product, and then the coarsely pulverized product is further finely pulverized using a jet mill. One or two or more of $D_{10}$, $D_{50}$, $D_{90}$, and $(D_{90}-D_{10})/D_{50}$ can also be adjusted by suitably controlling a pulverization condition.

(4) Acid Treatment Step

In the acid treatment step, for example, the pulverized product obtained in (3) above is immersed in an acidic aqueous solution. Although the details are not clear, it is considered that the acid treatment removes or reduces "heterogeneous phases" in the phosphor that do not contribute to the light emission or that reduce the light emission efficiency.

Examples of the acidic aqueous solution include an acidic aqueous solution containing one acid selected from acids such as hydrofluoric acid, nitric acid, and hydrochloric acid, and a mixed acid aqueous solution obtained by mixing two or more of the above acids. The acid is preferably nitric acid or hydrochloric acid and more preferably hydrochloric acid.

A concentration of the acidic aqueous solution is suitably set according to strength of the acid used, and is, for example, 0.5 to 50% by mass, preferably 1 to 30% by mass, and more preferably 1 to 10% by mass.

A temperature in a case of performing the acid treatment is preferably equal to or higher than 25° C. and equal to or lower than 90° C. and more preferably equal to or higher than 60° C. and equal to or lower than 90° C. By performing the treatment at a comparatively high temperature, it is easy to remove the heterogeneous phase.

A time of the acid treatment (an immersion time) is preferably equal to or more than 15 minutes and equal to or less than 80 minutes and more preferably equal to or more than 15 minutes and equal to or less than 60 minutes.

After the acid treatment, it is preferable to sufficiently wash the phosphor powder with water and dry it.

(5) Classification Step

In order to reduce the amount of fine powder (extremely fine phosphor particles that tend to deteriorate the conversion efficiency of blue light) in the powder, it is preferable to perform a suitable classification treatment. In order to effectively remove the fine powder, a classification method is preferably sedimentation classification as described below.

First, the powder obtained in (3) the pulverization step of the fired product or the powder obtained through (4) the acid treatment step is dispersed in a suitable liquid, for example, an aqueous solution of sodium hexametaphosphate in a container to obtain a dispersion.

Next, the dispersion is allowed to stand for a predetermined period of time to precipitate powders having comparatively large particle sizes among the powder in the dispersion.

After that, a supernatant is discharged.

Then, the operations of newly putting the aqueous solution of sodium hexametaphosphate into the container in which the sediment remains, dispersing the powder, allowing the mixture to stand, and discharging the supernatant are repeated multiple times. The "multiple times" is preferably equal to or more than 5 times. There is no particular upper limit to the number of times, but from a viewpoint of cost, it is, for example, equal to or less than 15 times, specifically equal to or less than 10 times.

A specific condition for the classification is only guideline, but the condition of the classification is preferably set so that a fine powder having a particle size equal to or less than 10 μm is removed, and the condition of the classification is more preferably set so that a fine powder having a particle size equal to or less than 7.5 μm is removed. In a case of the sedimentation classification, Stokes' equation for a sedimentation velocity of particles can be referred to for setting the condition.

For an example of specific condition for sedimentation classification, the examples which will be described later can be referred to.

<Light-Emitting Device, Image Display Device, and Illumination Device>

A light-emitting device can be obtained by combining the phosphor powder of the present embodiment and a light emitting source.

The light emitting source typically emits ultraviolet or visible light. For example, in a case where the light emitting source is a blue LED, the blue light emitted from the light emitting source hits the phosphor powder and the blue light is converted into light having a longer wavelength. That is, the phosphor powder of the present embodiment can be used as a wavelength conversion material that converts the blue light into light having a longer wavelength.

An example of a specific configuration of the light-emitting device will be described with reference to FIG. 1.

FIG. 1 is a schematic cross-sectional view showing an example of a structure of a light-emitting device. As shown in FIG. 1, a light-emitting device 100 includes a light-emitting element 120, a heat sink 130, a case 140, a first lead frame 150, a second lead frame 160, a bonding wire 170, a bonding wire 172, and a composite 40.

The light-emitting element 120 is mounted in a predetermined region on the upper surface of the heat sink 130. By mounting the light-emitting element 120 on the heat sink 130, the heat dissipation of the light-emitting element 120 can be enhanced. Further, a packaging substrate may be used instead of the heat sink 130.

The light-emitting element 120 is a semiconductor element that emits excitation light. As the light-emitting element 120, for example, an LED chip that generates light at a wavelength of equal to or more than 300 nm and equal to or less than 500 nm, corresponding to near-ultraviolet to blue light, can be used. One electrode (not shown in the drawings) arranged on the upper surface side of the light-emitting element 120 is connected to the surface of the first lead frame 150 through the bonding wire 170 such as a gold wire. In addition, the other electrode (not shown in the drawings) formed on the upper surface of the light-emitting element 120 is connected to the surface of the second lead frame 160 through the bonding wire 172 such as a gold wire.

In the case 140, a substantially funnel-shaped recess whose hole diameter gradually increases toward the upside from the bottom surface is formed. The light-emitting element 120 is provided on the bottom surface of the recess. The wall surface of the recess surrounding the light-emitting element 120 serves as a reflective plate.

The recess whose wall surface is formed by the case 140 is filled with the composite 40. The composite 40 is a wavelength conversion member that converts excitation light emitted from the light-emitting element 120 into light at a longer wavelength.

The composite 40 is obtained by dispersing at least the phosphor powder of the present embodiment in the sealing material 30 such as resin. In order to obtain white light of higher quality, the sealing material 30 may contain not only the phosphor powder of the present embodiment but also other phosphor powders.

The light-emitting device 100 emits a mixed color of light from the light-emitting element 120 and light emitted from the phosphor particles 1 excited by absorbing the light emitted from the light-emitting element 120. The light-emitting device 100 preferably emits white light by mixing the light from the light-emitting element 120 and the light generated from the phosphor particles 1.

Incidentally, FIG. 1 illustrates a surface-mounted type light-emitting device, but the light-emitting device is not limited to the surface-mounted type, and may be shell-type, chip-on-board (COB) type, or chip-scale package (CSP) type.

The light-emitting device is used in an image display device such as a display and an illumination device. For example, a liquid crystal display can be manufactured using the light-emitting device 100 as a backlight. In addition, the illumination device can be manufactured by performing suitable wiring using one or a plurality of the light-emitting devices 100.

The embodiments of the present invention have been described above, but these are examples of the present invention and various configurations other than the examples can also be adopted. In addition, the present invention is not limited to the above-described embodiment, and modifications, improvements, and the like within the range in which the object of the present invention can be achieved are included in the present invention.

EXAMPLES

The embodiment of the present invention will be described in detail based on examples and comparative examples. It is noted, just to be sure, that the present invention is not limited to only Examples.

Producing Phosphor Powder

Example 1

(1) Preparation of Raw Material Mixed Powder

First, premixing was performed. Specifically, among the raw materials shown in Table 1, $Si_3N_4$, AlN, and $CeO_2$ were mixed (dry-blended) for 30 minutes using a small V-type mixer, and then sieved with a nylon sieve having an opening of 150 μm. A premixed powder was thus obtained.

Next, in a glove box of the nitrogen atmosphere, the remaining materials ($Ca_3N_2$ and $Li_3N$) of the raw materials shown in Table 1 were added to the premixed powder, thoroughly dry-blended, and then sieved with a sieve having an opening of 500 μm. A raw material mixed powder was thus obtained.

(2) Firing

A container formed of boron nitride was filled with the raw material mixed powder. This container was placed in a furnace, and the raw material mixed powder was fired at 1800° C. for 8 hours in a $N_2$ atmosphere of 0.72 MPa·G.

(3) Pulverization of Fired Product

The fired product obtained in (2) was pulverized using a stamp mill. The pulverization by the stamp mill was repeated until a passing rate of a vibrating sieve having an opening of 250 μm exceeded 90%.

The fired product pulverized by the stamp mill was further pulverized by using a jet mill (manufactured by Nippon Pneumatic Mfg, PJM-80SP). In pulverization conditions, a sample supply rate was set as 50 g/min and a pulverization air pressure was set as 0.3 MPa.

(4) Acid Treatment

The pulverized fired product was put into hydrochloric acid for acid treatment.

Specifically, first, 35 to 37% by mass of hydrochloric acid and distilled water were mixed at a volume ratio of 50 mL:300 mL to prepare an aqueous solution of hydrochloric acid heated to 80° C. The fired product pulverized in (3) was added to this aqueous solution of hydrochloric acid and stirred for 0.5 hours for the acid treatment.

The acid-treated fired product was thoroughly washed with distilled water and then dried at 110° C. for 3 hours. Then, it was sieved with a sieve having an opening of 45 μm to remove coarse/aggregated particles.

(5) Removal of Fine Powder by Sedimentation Classification

First, an aqueous solution of 0.05% by mass sodium hexametaphosphate was prepared. Then, this aqueous solution was placed in a container having an inner diameter of 70 mm and a height of 120 mm up to a height of 110 mm.

Next, the acid-treated fired product was put into the container containing the above aqueous solution, thoroughly stirred and dispersed, and then allowed to stand still for 22 minutes. After standing still, a supernatant was discharged from the top by 90 mm. After that, the aqueous solution of sodium hexametaphosphate was added up to a height of 110 mm, and the powder was dispersed by stirring again, and the same treatment was performed. This operation was repeated 7 times to remove the fine powder contained in the acid-treated powder (incidentally, a classification point is 7.5 μm based on the Stokes' equation).

Then, a slurry at the bottom of the container was filtered while washing with water to collect a solid content, dried in a condition of 110° C. for 3 hours, and sieved with a sieve having an opening of 45 μm to crush aggregated particles.

From the above, the phosphor powder was obtained.

Example 2

A phosphor powder was obtained in the same manner as in Example 1, except that the sedimentation classification was not performed.

Comparative Example 1

A phosphor powder was obtained in the same manner as in Example 1, except that (a) a material shown in Table 1 was used as the raw material, (b) the acid treatment was not performed, and (c) the sedimentation classification was not performed.

<Confirmation of Chemical Composition/Crystal Structure>

Some phosphor powders were analyzed for composition as follows.

Amounts of Ca, Li, Ce, Si, and Al: the phosphor powder was dissolved by an alkali fusion method, and then the amounts thereof were measured with an ICP emission spectrometer (CIROS-120 manufactured by Rigaku Co., Ltd.).

Amount of 0 and N: measured with an oxygen nitrogen analyzer (manufactured by HORIBA, EMGA-920).

Based on the measurement results, x, y, the Si/Al atomic ratio, the O/N atomic ratio, the Li ratio of M, and the Ce ratio of M in the general formula $M_x(Si, Al)_2(N, O)_{3\pm y}$ were obtained.

In addition, the phosphor powder was dissolved with a mixed acid of hydrofluoric acid and nitric acid by a pressure acid decomposition method, and then, the contents of the Cr element, the Fe element, the Ni element, and the Ti element were measured by an ICP emission spectrometer.

The phosphor of Example 1 was also subjected to powder X-ray diffraction (XRD) measurement using Cu-Kα rays using an X-ray diffractometer (Ultima IV-N manufactured by Rigaku Co., Ltd.). The obtained XRD pattern is shown in FIG. 2. From the analysis of the obtained XRD pattern, crystals with lattice constants of a=0.9486 nm, b=0.5586 nm, and c=0.4933 nm as orthorhombic crystal were confirmed as a main phase and a small amount of $LiAlSi_2N_4$ was confirmed as the heterogeneous phase.

<Measurement of Particle Size Distribution>

The particle size distribution was measured by a laser diffraction scattering method based on JIS R 1629:1997 using LS13 320 (manufactured by Beckman Coulter, Inc.). Water was used as a measurement solvent.

As a specific procedure, first, a small amount of phosphor powder was added to an aqueous solution containing 0.05% by mass of sodium hexametaphosphate as a dispersant. Next, dispersion treatment was performed with a horn-type ultrasonic homogenizer (output of 300 W, horn diameter of 26 mm) to prepare a dispersion. The particle size distribution was measured using this dispersion. A 10% volume size $D_{10}$, a 50% volume size $D_{50}$, and a 90% volume size $D_{90}$ were obtained from the obtained cumulative volume frequency distribution curve.

<Evaluation>

(Fluorescence Peak Intensity)

A fluorescence spectrum of the phosphor powder was measured using a spectro fluorophotometer (F-7000, manufactured by Hitachi High-Tech Science Co., Ltd.) corrected with Rhodamine B and a secondary standard light source. Specifically, the fluorescence spectrum emitted by exciting the phosphor powder with monochromatic light having a wavelength of 455 nm was measured, and the fluorescence peak intensity and fluorescence peak wavelength were determined.

The fluorescence peak intensity varies depending on the measuring device and conditions. The fluorescence peak intensity described in the table below is a value in a case where the fluorescence peak intensity of a standard sample (YAG, more specifically P46Y3 manufactured by Mitsubishi Chemical Corporation) is set to 100.

(Internal Quantum Efficiency and External Quantum Efficiency)

Using a spectrophotometer (MCPD-7000 manufactured by Otsuka Electronics Co., Ltd.), internal quantum efficiency and external quantum efficiency of each phosphor powder were obtained by the following procedure.

(1) The phosphor powder was filled into a recessed part of a recessed cell to have a smooth surface. This recessed cell was attached to a predetermined position (a sample part) within an integrating sphere. Monochromatic light spectrally split into a wavelength of 455 nm from a light emitting source (Xe lamp) was introduced into the integrating sphere using an optical fiber. This monochromatic light (excitation light) was emitted to the phosphor powder filled in the recessed part of the recessed cell, and the fluorescence spectrum was measured. From the spectral data obtained, a peak wavelength was determined, and the number of excitation reflected light photons (Qref) and the number of fluorescence photons (Qem) were calculated. The number of excitation reflected light photons was calculated in a wavelength range of equal to or more than 450 nm and equal to or less than 465 nm, and the number of fluorescence photons was calculated in a wavelength range of equal to or more than 465 nm and equal to or less than 800 nm.

(2) In addition, instead of the recessed cell, a standard reflective plate (Spectralon manufactured by Lab-sphere, Inc.) having a reflectance of 99% was attached to the sample part, and a spectrum of the excitation light at a wavelength of 455 nm was measured. Then, the number of excitation light photons (Qex) was calculated from the spectrum in a wavelength range of equal to or more than 450 nm and equal to or less than 465 nm.

(3) From the Qref, Qem, and Qex obtained in (1) and (2) above, the internal quantum efficiency and the external quantum efficiency were calculated based on the following equations.

Internal quantum efficiency=(Qem/(Qex−Qref))×100

External quantum efficiency=(Qem/Qex)×100

Various pieces of information are collectively shown in Table 1.

In Table 1, "N.D." stands for Not Detected.

In addition, in Table 1, each raw material described in a column of "raw materials used" is as follows.

$Ca_3N_2$-1: $Ca_3N_2$ manufactured by Taiheiyo Cement Co., Ltd.

$Ca_3N_2$-2: $Ca_3N_2$ manufactured by CERAC, Inc. (currently Materion, Co.)

$Li_3N$-1: $Li_3N$ from Materion, Corp.

$Li_3N$-2: $Li_3N$ manufactured by CERAC, Inc. (currently Materion, Corp.)

$CeO_2$-1: $CeO_2$, C grade manufactured by Shin-Etsu Chemical Co., Ltd.

$Si_3N_4$-1: $Si_3N_4$ manufactured by Ube Industries Ltd., E10 grade

AlN-1: AlN manufactured by Tokuyama Corporation, E grade

TABLE 1

| | | Example/Comparative Example | | |
|---|---|---|---|---|
| | | Example 1 | Example 2 | Comparative Example 1 |
| Raw material (% by mass) | $Ca_3N_2$ | 19.528 | 19.528 | 19.528 |
| | $Li_3N$ | 3.900 | 3.900 | 3.900 |
| | $CeO_2$ | 3.345 | 3.345 | 3.345 |
| | $Si_3N_4$ | 55.437 | 55.437 | 55.437 |
| | AlN | 17.791 | 17.791 | 17.791 |
| Raw material used | $Ca_3N_2$ | $Ca_3N_2$-1 | $Ca_3N_2$-1 | $Ca_3N_2$-2 |
| | $Li_3N$ | $Li_3N$-1 | $Li_3N$-1 | $Li_3N$-2 |
| | $CeO_2$ | $CeO_2$-1 | $CeO_2$-1 | $CeO_2$-1 |
| | $Si_3N_4$ | $Si_3N_4$-1 | $Si_3N_4$-1 | $Si_3N_4$-1 |
| | AlN | AlN-1 | AlN-1 | AlN-1 |
| Chemical composition | x | 0.78 | 0.76 | 0.84 |
| | y | 0.33 | 0.34 | 0.34 |
| | Si/Al | 2.49 | 2.46 | 2.72 |
| | O/N | 0.04 | 0.05 | 0.05 |
| | Li/M (mol %) | 32.39 | 30.43 | 40.45 |
| | Ce/M (mol %) | 2.87 | 3.02 | 2.73 |
| Impurities (ppm) | Cr | N. D. | N.D. | 3.1 |
| | Fe | 6.6 | 7.3 | 17.4 |
| | Ni | N.D. | N.D. | Unmeasured |
| | Cr + Fe + Ni | 6.6 | 7.3 | >20.5 |
| | Ti | N.D. | N.D. | Unmeasured |
| Particle size distribution | $D_{10}$ (μm) | 9.9 | 6.0 | 6.4 |
| | $D_{50}$ (μm) | 16.2 | 14.7 | 13.9 |
| | $D_{90}$ (μm) | 25.0 | 24.5 | 23.0 |
| Fluorescence peak wavelength (nm) | | 595.8 | 600.3 | 595.3 |
| Production method | | Including hydrochloric acid treatment and sedimentation classification | Including hydrochloric acid treatment and not including sedimentation classification | Not including hydrochloric acid treatment and sedimentation classification |
| Relative fluorescence peak intensity (455 nm, P46Y3 ratio) | | 126.3 | 118.6 | 100.9 |
| Internal quantum efficiency | | 80.9% | 80.0% | 71.9% |
| External quantum efficiency | | 70.9% | 65.8% | 62.6% |

The phosphor powders of Examples 1 and 2 had a lower total content of Cr+Fe+Ni than Comparative Example 1, and exhibited excellent fluorescence peak intensity, internal quantum efficiency, and external quantum efficiency.

This application claims priority based on Japanese Patent Application No. 2020-202770 filed on Dec. 7, 2020, the disclosure of which is incorporated herein by reference in its entirety.

REFERENCE SIGNS LIST 1 phosphor particles
30 sealing material
40 composite
100 light-emitting device
120 light-emitting element
130 heat sink
140 case
150 first lead frame
160 second lead frame
170 bonding wire
172 bonding wire

The invention claimed is:

1. A phosphor powder including phosphor particles which are a phosphor represented by a general formula $M_x(Si, Al)_2(N, O)_{3\pm y}$ (where M is Li and one or more alkaline earth metal elements and $0.52 \leq x \leq 0.9$ and $0.06 \leq y \leq 0.36$ are satisfied) and in which a part of M is substituted with a Ce element, wherein a Si/Al atomic ratio is equal to or more than 1.5 and equal to or less than 6,
an O/N atomic ratio is equal to or more than 0 and equal to or less than 0.1,
5 to 50 mol % of M is Li, and
0.5 to 10 mol % of M is Ce,
a total content of a Cr element, a Fe element, and a Ni element in the phosphor powder is from 0.01 ppm or more to 10 ppm or less, and
a content of the Cr element in the phosphor powder is equal to or less than 3 ppm, and
a $D_{10}$ of the phosphor powder is from 2 μm or more to 15 μm or less.

2. The phosphor powder according to claim 1, wherein a content of a Ti element in the phosphor powder is equal to or less than 5 ppm.

3. A light-emitting device comprising:
the phosphor powder according to claim 1; and
a light emitting source.

4. The light-emitting device according to claim 3, wherein the light emitting source emits ultraviolet light or visible light.

5. An image display device comprising:
the light-emitting device according to claim 3.

6. An illumination device comprising:
the light-emitting device according to claim 3.

\* \* \* \* \*